(12) United States Patent
Shin et al.

(10) Patent No.: US 9,756,767 B2
(45) Date of Patent: Sep. 5, 2017

(54) POWER CONVERSION APPARATUS

(71) Applicant: HONDA MOTOR CO., LTD., Tokyo (JP)

(72) Inventors: Masanori Shin, Wako (JP); Takayuki Komatsu, Wako (JP); Katsuhiro Nakagawa, Wako (JP); Yasunori Yamamoto, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/043,864

(22) Filed: Feb. 15, 2016

(65) Prior Publication Data
US 2016/0249492 A1 Aug. 25, 2016

(30) Foreign Application Priority Data
Feb. 20, 2015 (JP) .................. 2015-031564

(51) Int. Cl.
*H05K 7/20* (2006.01)
*H01L 23/473* (2006.01)
*H02M 7/00* (2006.01)

(52) U.S. Cl.
CPC ......... *H05K 7/20909* (2013.01); *H02M 7/003* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS 5,121,291 A 6/1992 Cope et al.
8,462,505 B2 6/2013 Nagami et al.
(Continued)

FOREIGN PATENT DOCUMENTS

JP H06-62574 3/1994
JP 2003-086157 3/2003
(Continued)

OTHER PUBLICATIONS

Japanese Office Action dated Oct. 28, 2016 (Partial English translation included).

*Primary Examiner* — Anthony Haughton
*Assistant Examiner* — Razmeen Gafur
(74) *Attorney, Agent, or Firm* — Rankin, Hill & Clark LLP

(57) ABSTRACT

A power conversion apparatus includes: a cooling air passage defined with cooling fins of upper and lower converters and cooling fins of an inverter opposed to each other; upper and lower blowing fans provided upstream of the cooling air passage; and upper and lower sucking fans provided downstream of the cooling air passage and at positions offset from the converters. The blowing fans are provided for supplying cooling air from upstream of the cooling air passage, and the sucking fans are provided for discharging air from within a casing of the apparatus to the outside.

4 Claims, 8 Drawing Sheets

(56) References Cited

U.S. PATENT DOCUMENTS

| | | | |
|---|---|---|---|
| 8,848,362 B1* | 9/2014 | Che | G05B 9/02 361/676 |
| 9,232,684 B2 | 1/2016 | Aoki | |
| 2004/0100770 A1* | 5/2004 | Chu | H05K 7/20754 361/698 |
| 2004/0201960 A1* | 10/2004 | Karppinen | H05K 7/20572 361/690 |
| 2005/0083655 A1* | 4/2005 | Jairazbhoy | H01L 23/3733 361/699 |
| 2005/0207134 A1* | 9/2005 | Belady | H05K 1/14 361/796 |
| 2006/0279928 A1* | 12/2006 | Lanni | H05K 7/20136 361/695 |
| 2007/0053154 A1* | 3/2007 | Fukuda | G11B 33/022 361/679.33 |
| 2008/0158815 A1* | 7/2008 | Campbell | H05K 7/20754 361/696 |
| 2009/0097200 A1* | 4/2009 | Sharma | G06F 1/18 361/688 |
| 2009/0141447 A1* | 6/2009 | Soma | B60K 6/445 361/694 |
| 2009/0231811 A1* | 9/2009 | Tokuyama | H01L 23/36 361/699 |
| 2009/0323259 A1* | 12/2009 | Errera | F01N 5/04 361/676 |
| 2010/0079946 A1* | 4/2010 | Bharani | H02K 5/20 361/695 |
| 2010/0091458 A1* | 4/2010 | Mosier, Jr. | H05K 7/20572 361/695 |
| 2010/0254087 A1* | 10/2010 | Godfroy | H05K 5/06 361/699 |
| 2010/0277871 A1* | 11/2010 | Kitanaka | B60L 9/16 361/710 |
| 2011/0292604 A1* | 12/2011 | Janes | H05K 7/20909 361/695 |
| 2012/0014063 A1* | 1/2012 | Weiss | H05K 7/20163 361/697 |
| 2012/0020021 A1* | 1/2012 | Kishimoto | H02M 5/271 361/695 |
| 2012/0050993 A1* | 3/2012 | Suzuki | H05K 7/20936 361/700 |
| 2012/0063089 A1* | 3/2012 | Kishimoto | H05K 7/20909 361/697 |
| 2013/0039008 A1* | 2/2013 | Hoffmann | H05K 7/20909 361/692 |
| 2013/0120935 A1* | 5/2013 | Huang | G06F 1/20 361/695 |
| 2013/0141867 A1* | 6/2013 | Zhou | H05K 7/20909 361/691 |
| 2013/0163193 A1* | 6/2013 | Ballantine | H05K 7/20763 361/679.47 |
| 2014/0198449 A1* | 7/2014 | Osada | H05K 7/20927 361/689 |
| 2014/0247554 A1* | 9/2014 | Sharma | H05K 7/1432 361/695 |
| 2014/0293542 A1* | 10/2014 | Vetrovec | H01L 23/473 361/699 |
| 2014/0301036 A1* | 10/2014 | Chainer | H05K 7/2079 361/679.47 |
| 2014/0355211 A1* | 12/2014 | Patil | H05K 1/0201 361/695 |

FOREIGN PATENT DOCUMENTS

| | | |
|---|---|---|
| JP | 2011-211773 | 10/2011 |
| JP | 2012-186352 | 9/2012 |
| JP | 2012-223033 | 11/2012 |
| JP | 5355822 | 9/2013 |
| JP | 2014-090640 | 5/2014 |

* cited by examiner

POWER CONVERSION APPARATUS

FIELD OF THE INVENTION

The present invention relates to power conversion apparatus which are constructed to convert DC electric power into AC electric power by means of power conversion units and supply the converted AC electric power to outside of the apparatus.

BACKGROUND OF THE INVENTION

Among the conventionally-known power conversion apparatus are ones in which a plurality of cooling units (hereinafter referred to as "power conversion units") are accommodated within an apparatus casing with respective cooling fins of the plurality of cooling units disposed opposed to one another, and in which cooling air is supplied to between the opposed cooling fins. In such power conversion apparatus, semiconductor devices (hereinafter referred to as "conversion devices") are mounted on respective mounting surfaces of the power conversion units, and heat of the conversion devices is transmitted to the cooling fins.

Heat of the conversion devices transmitted to the cooling fins can be cooled efficiently by the cooling air supplied to between the opposed cooling fins (see, for example, Japanese Patent No. 5355822). By the heat of the conversion devices (i.e., power conversion units) being cooled with the opposed cooling fins as noted above, it is possible to reduce the weight and size of the power conversion apparatus.

In such conventionally-known power conversion apparatus, a portion of the heat produced by the conversion devices is radiated directly from the respective surfaces of the conversion devices to the interior space of the casing. Further, other heat-producing sources than the power conversion units are disposed dispersedly in the interior of the power conversion apparatus. Thus, temperature in the interior of the casing may undesirably increase due to the heat radiated directly from the surfaces of the conversion devices to the interior space of the casing and the heat radiated from the heat-producing sources to the interior space of the casing.

Therefore, a technique is presently required for maintaining at suitable temperature the surfaces of the conversion devices and the heat-producing sources disposed dispersedly in the interior of the casing. However, with the power conversion apparatus disclosed in the above-identified U.S. Pat. No. 5,355,822, where the cooling air is supplied to between the opposed cooling fans, it is difficult to cool the entire interior space of the casing, and thus, it is difficult to maintain at suitable temperature the surfaces of the conversion devices and the heat-producing sources disposed dispersedly in the interior of the casing.

Further, in recent years, portable power conversion apparatus for mounting on a vehicle have been proposed, and thus, there has been an increasing demand for a lighter and more compact portable power conversion apparatus, i.e. a portable power conversion apparatus of a reduced weight and size. As one approach for reducing the weight and size of the portable power conversion apparatus, it is conceivable to narrow, or reduce the size of, the interior space of the casing. However, such an approach would further increase the necessity for maintaining at suitable temperature the surfaces of the conversion devices (power conversion units) and the heat-producing sources disposed dispersedly in the interior of the casing

SUMMARY OF THE INVENTION

In view of the foregoing prior art problems, it is an object of the present invention to provide an improved power conversion apparatus which can be reduced in weight and size and yet can effectively cool the power conversion units and the cool heat-producing sources disposed dispersedly in the interior of the casing.

In order to accomplish the above-mentioned object, the present invention provides an improved portable power conversion apparatus which includes a plurality of power conversion units provided within an apparatus casing and converts DC electric power into AC electric power by means of the power conversion units so that the converted AC electric power can be output to outside the apparatus, which comprises: a cooling air passage defined with the plurality of power conversion units disposed in such a manner that respective heat radiation sections of the power conversion units are opposed to each other; a first cooling fan provided upstream of the cooling air passage for supplying cooling air directly to the cooling air passage; and a second cooling fan provided downstream of the cooling air passage and at a position spaced from the power conversion units defining the cooling air passage, the second cooling fan discharging air within the casing to the outside.

According to the present invention, the cooling air passage is defined with the plurality of power conversion units disposed in such a manner that the respective heat radiation sections of the power conversion units are opposed to each other, and the first cooling fan supplies cooling air from upstream of the cooling air passage directly to the cooling air passage. With such arrangements, the cooling air blown out from the first cooling fan can be applied directly to the heat radiation sections of the plurality of power conversion units, so that the heat radiation sections can be cooled efficiently.

Further, according to the present invention, the cooling air can be supplied by the first cooling fan directly to the cooling air passage, the single or same cooling air passage can be used for the heat radiation sections of the plurality of power conversion units. In other words, the same first cooling fan can be used for the plurality of power conversion units. Therefore, it is not necessary to provide separate cooling air passages and first cooling fans for the heat radiation sections of the plurality of power conversion units. Thus, it is possible to not only reduce the numbers of the cooling air passages and first cooling fans, but also reduce a size of a space required for providing therein such cooling air passages and cooling fans. As a result, the plurality of power conversion units and the cooling air passage can be provided efficiently in a compact space, and thus, a reduced weight and size of the portable power conversion apparatus is achievable.

Further, according to the present invention, the second cooling fan is disposed downstream of the cooling air passage at a position spaced (or offset) from the power conversion units defining the cooling air passage. Namely, the second cooling fan is disposed in such a manner that an air-sucking opening of the second cooling fan faces the interior of the casing over a wide area or range. Thus, by driving the second cooling fan, it is possible to discharge air within the entire region (wide range) of the casing to the outside of the casing. By the air within the casing being discharged as above, heat radiated from the surfaces of the power conversion units and heat radiated from various heat-producing sources provided dispersedly within the casing can be effectively discharged to the outside of the casing together with the air within the casing. In this way it is possible to effectively cool the conversion units and the heat-producing sources provided dispersedly within the casing. Note that the power conversion units may be in the form of semiconductor devices or other devices.

In a preferred implementation of the present invention, the first cooling fan is an axial flow fan provided on an extension line of the cooling air passage. Thus, cooling air can be supplied from the first cooling fan directly and straight to the cooling air passage. In this way, a large amount of cooling air can be supplied from the first cooling fan to the cooling air passage, and thus, the opposed heat radiation sections can be cooled with a high efficiency by the cooling air.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

Certain preferred embodiments of the present invention will hereinafter be described in detail, by way of example only with reference to the accompanying drawings, in which.

DETAILED DESCRIPTION OF THE INVENTION

In the following description, the terms "front", "rear", "left" and "right", etc. are used to refer to directions as viewed from a human operator towing a power conversion apparatus 10.

Figure 1:
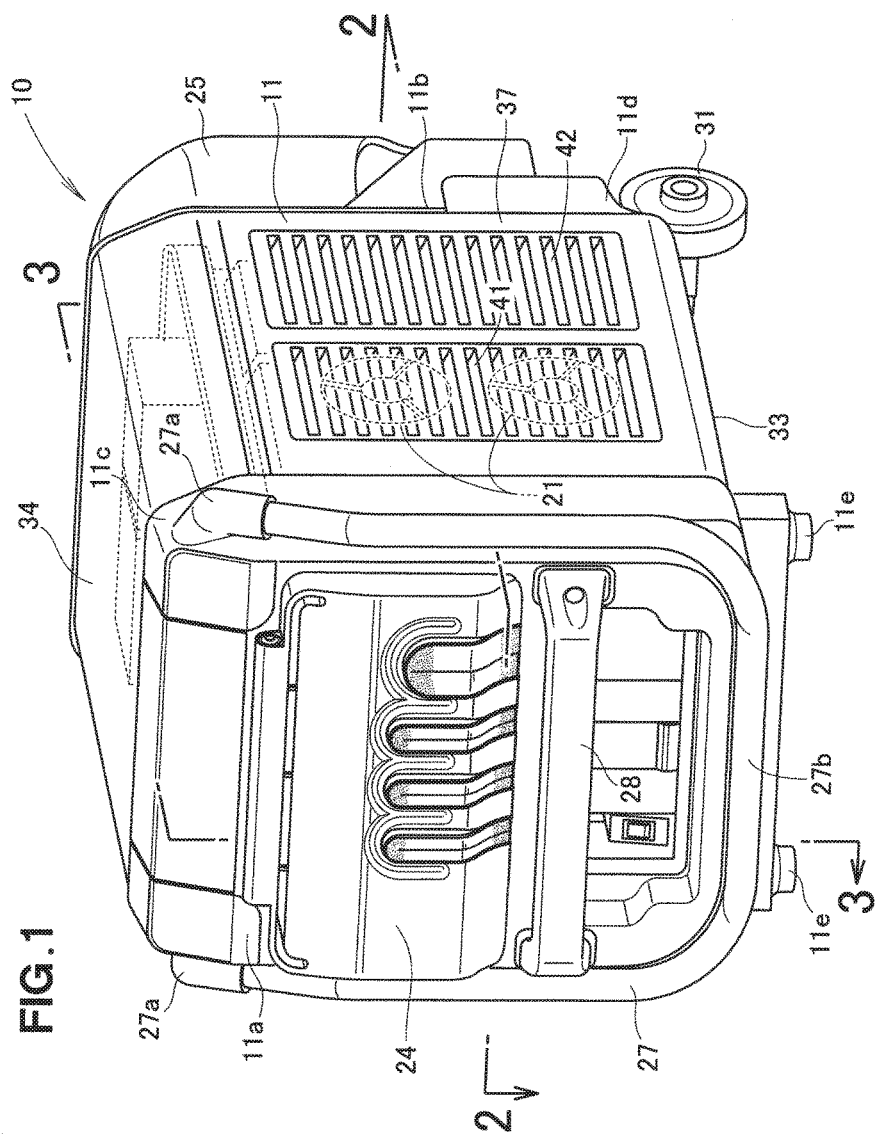
FIG. 1 is a perspective view showing an embodiment of a power conversion apparatus of the present invention.
Figure 2:
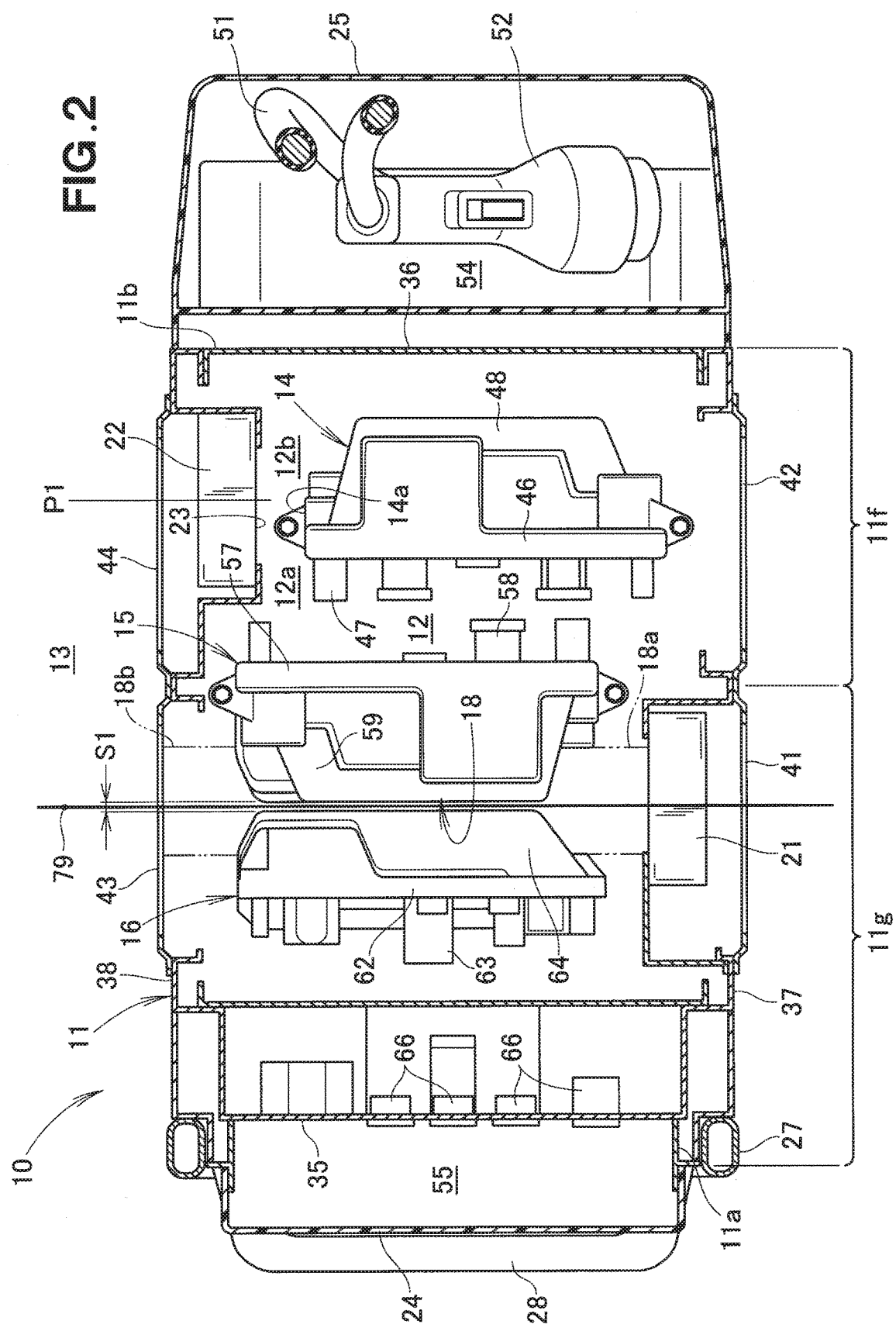
FIG. 2 is a sectional view taken along line 2-2 of FIG. 1.

FIG. 1 is a perspective view showing an embodiment of a power conversion apparatus 10 of the present invention, and FIG. 2 is a sectional view taken along the 2-2 line of FIG. 1. As shown in FIGS. 1 and 2, the power conversion apparatus 10 includes: an apparatus casing 11 of a substantial rectangular parallelepiped shape; a plurality of power conversion units 14 to 16 provided in the interior 12 of the casing 11; a cooling air passage 18 formed or defined between the plurality of power conversion units 14 to 16; a plurality of blowing fans (first cooling fans) 21 for supplying external air to the cooling air passage 18; and a plurality of sucking fans (second cooling fans) 22 for discharging internal air from the interior 12 of the casing 11 to the outside 13.

The power conversion apparatus 10 further includes: a front cover 24 openably/closably connected to a front section 11a of the casing 11; a rear cover 25 openably/closably connected to a rear section 11b of the casing 11; a towing handle 27 connected to a front upper section 11e of the casing 11 so that it is pivotable in a vertical (up-down) direction; a front carrying grip 28 fixedly provided on the front section 11a of the casing 11; a rear carrying grip 29 fixedly provided on the rear section 11b of the casing 11; and left and right wheels 31 (right wheel 31 is not shown) mounted on a rear lower section 11d of the casing 11.

The human operator can hold and move up a grip section 27b of the towing handle 27 to pivot the towing handle 27 upwardly about base sections 27a of the handle 27 and then lift front foot sections 11e of the casing 11 up from the ground or the like. In this condition, the power conversion apparatus 10 can be towed forward on the wheels 31 by the human operator pulling forward the grip section 27b. Also, the power conversion apparatus 10 can be carried to a desired place by the human operator holding the front and rear grips 28 and 29 and lifting the power conversion apparatus 10.

Thus, using the towing handle 27 and the front and rear grips 28 and 29, the power conversion apparatus 10 can be stored in a garage or the like when the apparatus 10 is not to be used and can be loaded, for example, into a baggage compartment or the like of a vehicle and transferred to a desired place of use when the apparatus 10 is to be used. The power conversion apparatus 10 transferred to the desired place of use can be used at that place after being unloaded from the baggage compartment or the like of the vehicle. Namely, the embodiment of the power conversion apparatus 10 of the invention is a portable type power conversion apparatus.

The apparatus casing 11 is formed in a substantial rectangular parallelepiped shape with a bottom section 33, an upper section 34, a front wall 35, a rear wall 36, a left side wall 37 and a right side wall 38. A left front louver 41 and a left rear louver 42 are formed in the left side wall 37 so that the left side wall 37 is opened through the left front louver 41 and the left rear louver 42. Similarly, a right front louver 43 and a right rear louver 44 are formed in the right side wall 38 so that the right side wall 38 is opened through the right front louver 43 and the right rear louver 44.

The power conversion units 14 to 16 are provided in the interior 12 of the casing 11, and the power conversion units 14 to 16 include: a plurality of first converters (power conversion units) 14 accommodated in a rear half section of the casing 11; a plurality of second converters (power conversion units) 15 accommodated in a front half section 11g of the casing 11; and an inverter (power conversion unit) 16.

Figure 3:
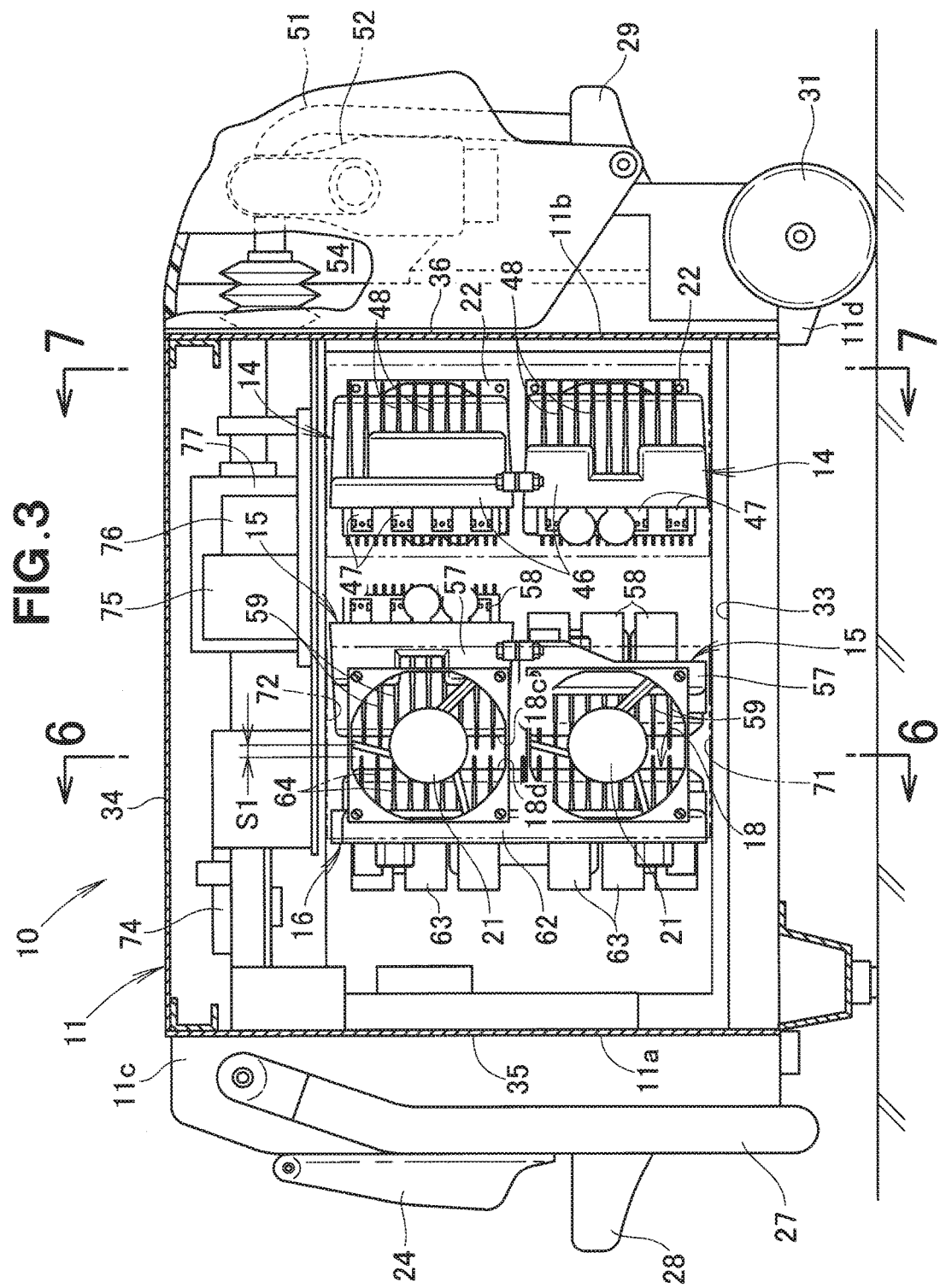
FIG. 3 is a sectional view taken along line 3-3 of FIG. 1.
Figure 4:
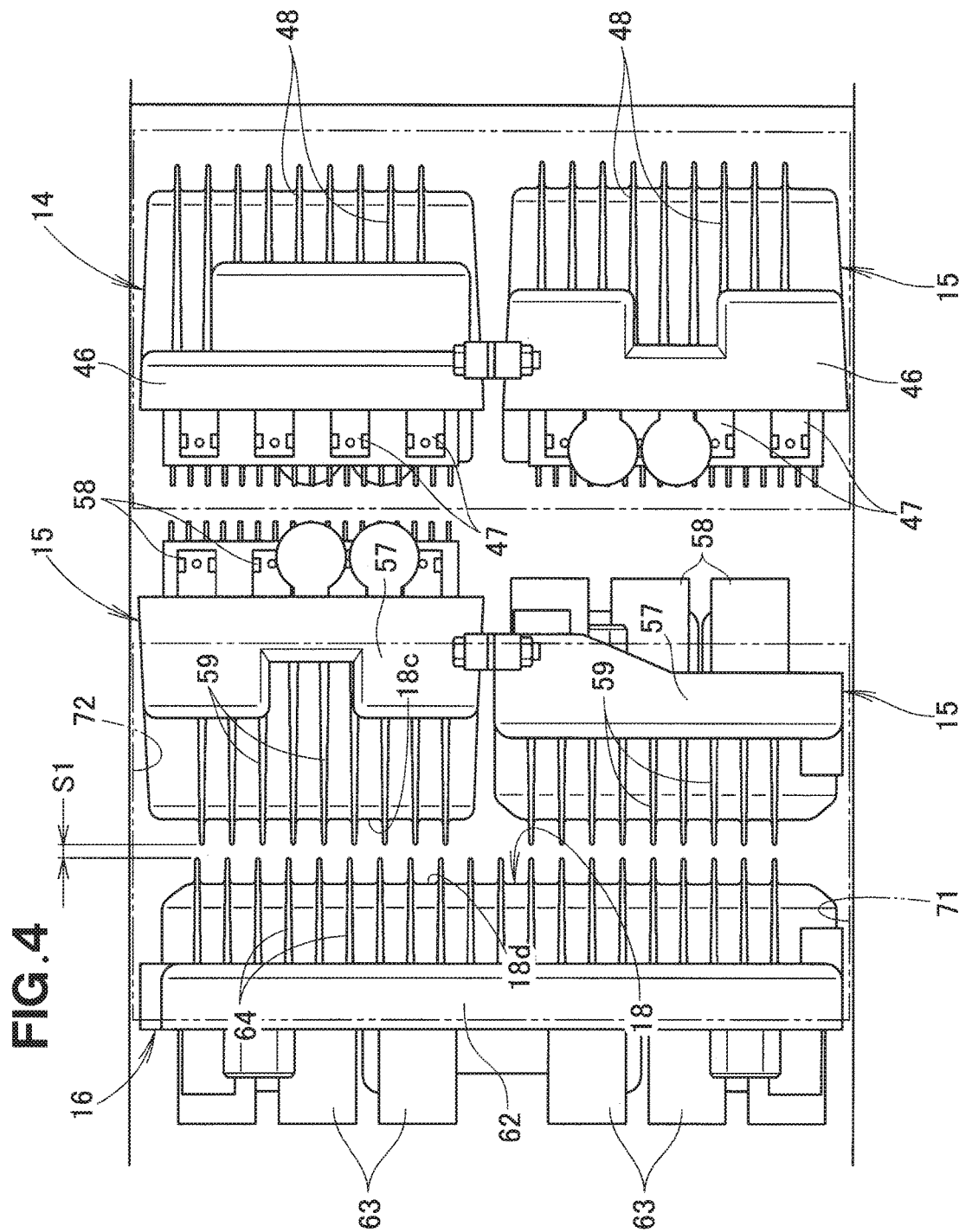
FIG. 4 is a side view showing first converters, second converters and an inverter of FIG. 3.

As shown in FIGS. 3 and 4, the plurality of first converters 14 include the first converter 14 provided in an upper portion of the rear half section 11f, and the first converter 14 provided in a lower portion of the rear half section 11f. Each of the first converters 14 is a boosting type DC-DC converter that includes: a base 46; conversion devices 47 provided on a mounting surface of the base 46; and a plurality of cooling fins (heat radiation sections) 48 projecting from another surface of the base 46 opposite the mounting surface. The conversion devices 47 may be in the form of semiconductor devices or the like.

The base 46 of the first converter 14 is disposed to extend in a left-right direction and projects vertically upward. Further, the plurality of cooling fins 48 of the first converter 14 is disposed horizontally to extend in the left-right direction (see FIG. 2). Hereinafter, the first converter 14 provided in the upper portion of the rear half section 11f will be referred to as "upper first converter 14", while the first converter 14 provided in the lower portion of the rear half section 11f will be referred to as "lower first converter 14".

A power feed cable 51 is connected at its base section to the upper first converter 14, and a power feed connector 51 is connected to the distal end of the power feed cable 51. Further, the upper first converter 14 is connected to the lower first converter 14. The power feed cable 51 is storable in a rear storage section 54 of the casing 11, and the base section of the power feed cable 51 extends in an upper portion of the rear storage section 54 to be connected to the first cable 14. With the power feed cable 51 stored in the rear storage section 54, the power feed cable 51 is covered with the rear cover 25.

The power feed cable 51 can be pulled out from the rear storage section 54, and the power feed connector of the pulled-out power feed cable 51 is connectable to a power feed plug of the vehicle (more specifically, vehicle that generates DC electric power). Examples of such a vehicle that generates DC electric power include a fuel cell vehicle and a plug-in hybrid vehicle. With the power feed connector connected to the power feed plug, DC voltage generated by the vehicle is directed to the upper first converter 14 via the power feed cable 51. The DC voltage directed to the upper first converter 14 is then directed to the lower first converter 14.

The upper first converter 14 is provided in an upper portion of the rear half-section 11f of the casing 11; and the base section of the power feed cable 51 extends in the upper portion of the rear storage section 54 and is then connected to the first cable 14. The rear storage section 54 is provided in the rear section 11b of the casing 11, and thus, a portion of the power feed cable 51 between the upper first converter 14 and the rear section 11b of the casing 11 can be reduced in length. Further, with the upper and lower first converters 14 disposed together close to each other in the rear half section 11f, a connecting distance between the upper and lower first converters 14 can be reduced.

The plurality of second converters 15 include the second converter 15 provided in an upper portion of the front half section 11g, and the second converter 15 provided in a lower portion of the front half section 11g. Like the aforementioned first converters 14, each of the second converters 15 is a boosting type DC-DC converter that includes: a base 57; conversion devices 58 provided on a mounting surface of the base 57; and a plurality of cooling fins (heat radiation sections) 59 projecting from another surface of the base 57 opposite the mounting surface. The conversion devices 58 may be in the form of semiconductor devices or the like.

The base 57 of the second converter 15 is disposed to extend in the left-right direction and projects vertically-upward. Further, the plurality of cooling fins 15 is disposed horizontally to extend in the left-right direction (see FIG. 2). Hereinafter, the second converter 15 provided in the upper portion of the front half section 11g will be referred to as "upper second converter 15", while the second converter 15 provided in the lower portion of the front half section 11g will be referred to as "lower second converter 15".

The above-mentioned lower first converter 14 is connected to the upper second converter 15 that is in turn connected to the lower second converter 15. Thus, DC voltage supplied from the vehicle to the upper first converter 14 is directed from the lower first converter 14 to the upper second converter 15 and then to the lower second converter 15. Because the DC voltage supplied from the vehicle is directed to the upper and lower first converters 14 and the upper and lower second converters 15 as above, it can be boosted by the upper and lower first converters 14 and the upper and lower second converters 15.

Further, the upper second converter 15 is disposed in an upper portion of the front half section 11g adjacent to the lower first converter 14, and thus, a connecting distance between the lower first converter 14 and the upper second converter 15 can be reduced. Further, because the upper and lower second converters 15 are disposed together close to each other in the front half section 11g, a connecting distance between the upper and lower second converters 15 can be reduced.

Furthermore, because the inverter 16 is connected to the lower second converter 15, the DC voltage is directed from the lower second converter 15 to the inverter 16. The inverter 16 is provided in the front half section 11g of the casing 11 and located forward of the upper and lower second converters 15 and adjacent to the lower second converter 15. Thus, a connecting distance between the lower second converter 15 and the inverter 16 can be reduced.

The inverter 16 includes: a base 62; conversion devices 63 provided on a mounting surface of the base 62; and a plurality of cooling fins (heat radiation sections) 64 projecting from another surface of the base 62 opposite the mounting surface. The base 62 of the inverter 16 is disposed to extend in the left-right direction and projects vertically upward. Further, the plurality of cooling fins 59 of the inverter 16 is disposed horizontally to extend in the left-right direction (see FIG. 2). The conversion devices 63 may be in the form of semiconductor devices or the like. The DC voltage boosted by the upper and lower first converters 14 and the upper and lower second converters 15 is converted into AC voltage by the inverter 16.

Referring now back to FIG. 2, a plurality of electrical outlets 66 is connected to the inverter 16. These electrical outlets 66 are accommodated in a front storage section 55 of the casing 11 and covered with the front cover 24. By an output cable for a household electric device, outdoor lighting device or the like being connected to any one of the electrical outlets 66, AC power converted by the power conversion apparatus 10 is directed to the household electric device, outdoor lighting device or the like via the electrical outlet 66 and the cable.

Namely, with the power conversion apparatus 10, DC voltage supplied from a fuel cell vehicle, plug-in hybrid vehicle or the like can be boosted by means of the upper and lower first converters 14 and the upper and lower second converters 15, and the thus-boosted DC voltage can be converted into AC voltage by means of the inverter 16 so that the thus-converted AC voltage can be supplied to a household electric device, outdoor lighting device or the like.

The inverter 16 is disposed adjacent to the front section 11a of the casing 11, and the electrical outlets 66 are disposed in the front storage section 55 of the casing 11. The front storage section 55 is provided in the front section 11a of the casing 11. Thus, an output; cable 67 between the inverter 16 and front section 11a of the casing 11 can be reduced in length.

Figure 5:
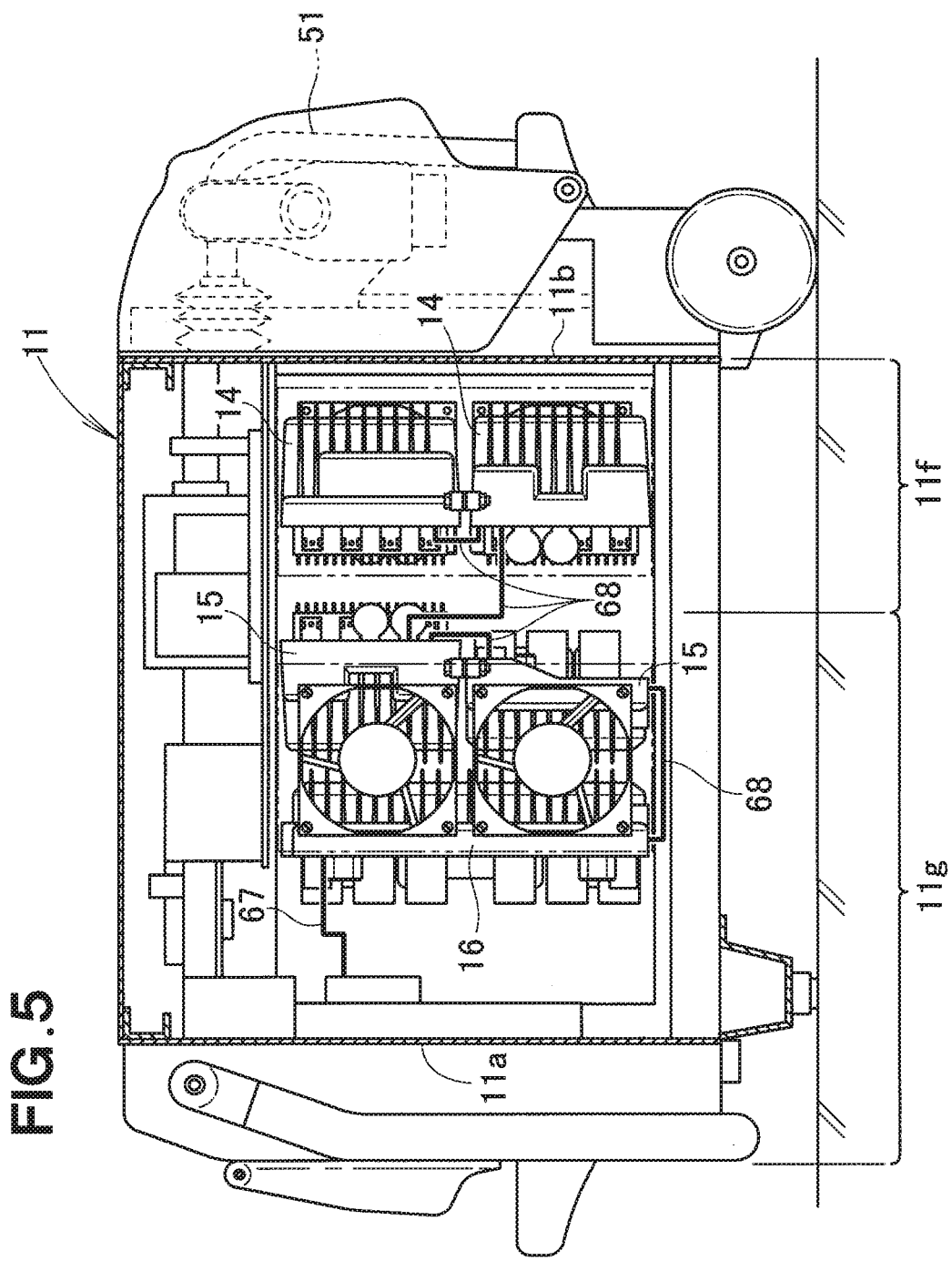
FIG. 5 is a side view showing connected states among the first converters, the second converters and the inverter of FIG. 3.

Namely, as shown in FIG. 5, the upper and lower first converters 14 are disposed together close to each other in the rear half section 11f of the casing 11. Further, the upper and lower second converters 15 are disposed together close to each other in the front half section 11g of the casing 11 and adjacent to the upper and lower first converters 14. Furthermore, the inverter 16 is disposed in the front half section 11g of the casing 11 and adjacent to the upper and lower second converters 15. Thus, connection cables 68 connecting the upper first converter 14, the lower first converters 14, the upper second converter 15 and the lower second converter 15 can be reduced in length. Further, the power feed cable 51 between the upper first converter 14 and the rear section 11b of the casing 11 can be reduced in length, and the output cable 67 between the inverter 16 and the front section 11a of the casing 11 can be reduced in length. In this way, the power supplied from the vehicle can be transmitted efficiently to the electrical outlets 66, so that it is possible to reduce a heat generation amount of the power conversion apparatus 10.

Further, as shown in FIGS. 2 and 4, the plurality of cooling fins 64 of the inverter 16 is disposed opposed to the plurality of cooling fins 59 of the upper and lower second converters 15 with a space or interval S1 therebetween. A lower end portion of the upper second converter 15 and an upper end portion of the lower second converter 15 are interconnected with no space therebetween. Further, a space between a lower end portion of the lower second converter 15 and a lower end portion of the inverter 16 is closed by an under guard member 71, and a space between an upper end portion of the upper second converter 15 and an upper end portion of the inverter 16 is closed by an upper guard member 72.

The cooling air passage 18 is defined by the upper and lower second converters 15, the inverter 16, the under guard member 71 and the upper guard member 72. To facilitate understanding of a shape of the cooling air passage 18, regions 18a and 18b upstream and downstream of the cooling air passage 18 (hereinafter referred to as "upstream region 18a" and "downstream region 18b") are depicted by imaginary lines.

The cooling fins 59 of the upper and lower second converters 15 are disposed adjacent to a rear wall portion 18c of the cooling air passage 18. Namely, the cooling fins 59 of the upper and lower second converters 15 are exposed to the cooling air passage 18. The plurality of cooling fins 59 is disposed horizontally in a direction from the upstream region 18a to the downstream region 18b. Stated differently, the plurality of cooling fins 59 is disposed in a direction where cooling air flows through the cooling air passage 18.

Figure 6:
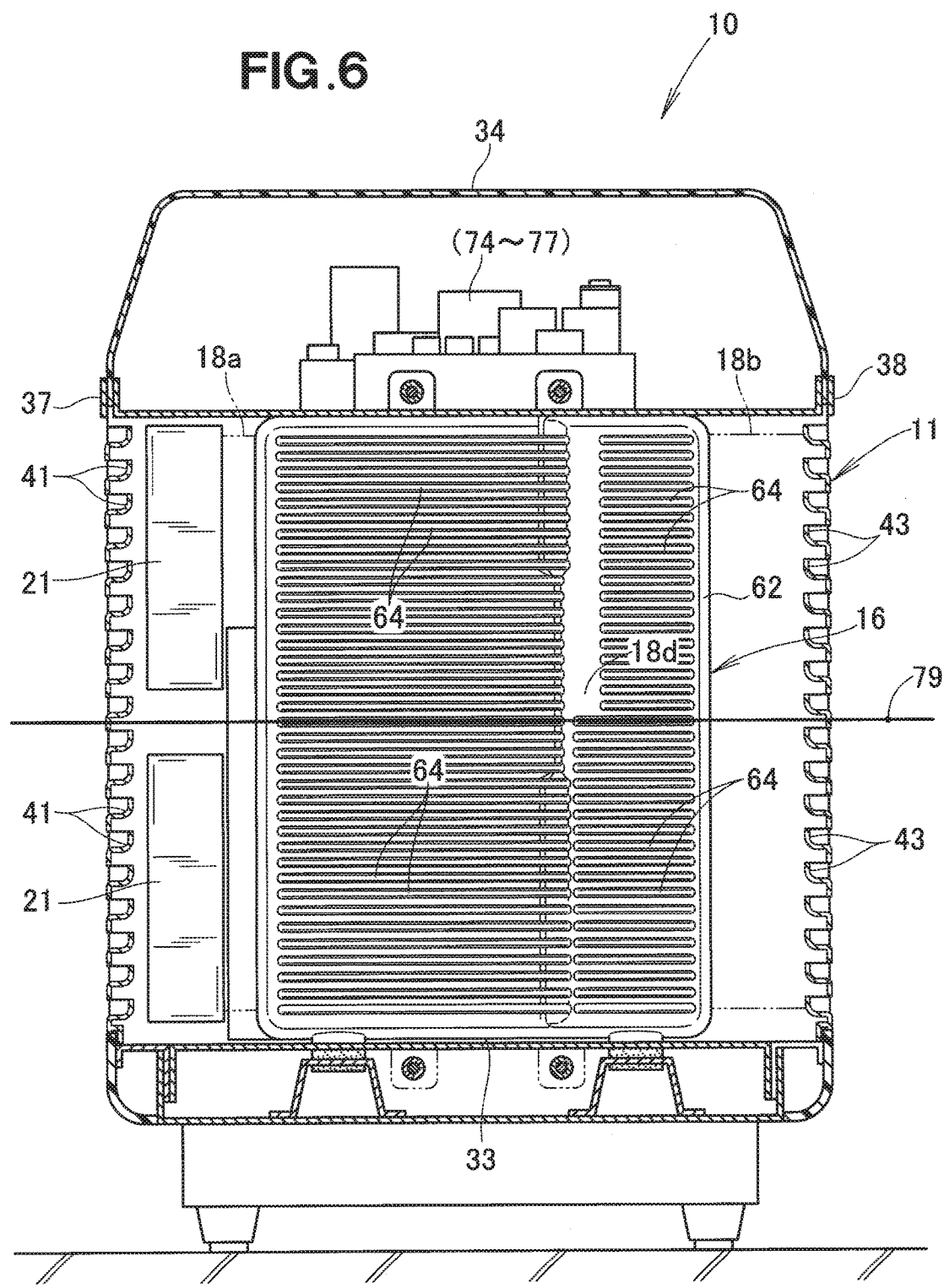
FIG. 6 is a sectional view taken along line 6-6 of FIG. 3.

Further, as shown in FIG. 6, the cooling fins 64 of the inverter 16 are disposed adjacent to a front wall portion 18d of the cooling air passage 18. Namely, the plurality of cooling fins 64 of the inverter 16 is exposed to the cooling air passage 18. Like the plurality of cooling fins 59, the plurality of cooling fins 64 of the inverter 16 is disposed horizontally in the direction from the upstream region 18a to the downstream region 18b. Stated differently, the plurality of cooling fins 64 of the inverter 16 is disposed in the same direction where the cooling air flows through the cooling air passage 18.

Further, as shown in FIGS. 2 and 4, the cooling fins 48 of the upper and lower first converters 14 are also disposed horizontally in the left-to-right direction, like the cooling fins 59 and 64. Namely, the cooling fins 48 of the upper and lower first converters 14 are disposed parallel to the cooling fins 59 and the cooling fins 64.

Further, heat-producing sources 74 to 77 are disposed dispersedly in an upper portion of the interior 12 of the casing 11 and particularly above the upper first converter 14, the upper second converter 15 and the inverter 16. Examples of the heat-producing sources 74 to 77 include an interface 74 of the first converter 14, second converter 15 and inverter 16, a main contactor 75, a pre-charge contactor 76 and a resistor 77.

Further, as shown in FIGS. 4 and 6, blowing fans 21 are provided in upper and lower portions of the upstream region 18a (i.e., left side region) of the cooling air passage 18. A region leftward of the blowing fans 21 (i.e., upstream region 18a of the cooling air passage 18) is opened through the left front louver 41, and the downstream region 18b (i.e., right side region) of the cooling air passage 18 is opened through the right front louver 43. Hereinbelow, the blowing fan 21 provided in the upper portion of the upstream region 18a will be referred to as "upper blowing fan 21", and the blowing fan 21 provided in the lower portion of the upstream region 18a will be referred to as "lower blowing fan 21".

Further, as seen in FIG. 2, the upper blowing fan 21 and the lower blowing fan 21 (see also FIG. 3) are provided on an extension line 79 of the cooling air passage 18. The extension line 79 is an imaginary straight line extending centrally through the width of the cooling air passage 18 as viewed in top plan. The upper blowing fan 21 (see FIG. 3) and the lower blowing fan 21 are each an axial flow fan capable of blowing cooling air straight to the cooling air passage 18 along the extension line 79.

Thus, cooling air is blown out from the upper and lower blowing fans 21 straight to the cooling air passage 18. Namely, the cooling air blown out from the upper and lower blowing fans 21 is supplied directly and straight to the cooling air passage 18. In this manner, a large amount of cooling air can be applied efficiently from the upper and lower blowing fans 21 to the cooling air passage 18.

Namely, the cooling fins 59 of the upper second converter 15 (see 4) and the lower second converter 15 can be exposed to the large amount of cooling air. Also, the cooling fins 64 of the inverter 16 can be exposed to the large amount of cooling air. In this way, the cooling fins 59 of the upper and lower second converters 15 and the cooling fins 64 of the inverter 16 can be cooled efficiently.

Further, because the cooling fins 59 of the upper and lower second converters 15 and the cooling fins 64 of the inverter 16 are exposed to the cooling air passage 18, the single or same cooling air passage 18 can be used for the cooling fins 59 of the upper and lower second converters 15 and the cooling fins 64 of the inverter 16. In other words, the same upper blowing fan 21 and lower blowing fan 21 can be used for the cooling fins 59 of the upper and lower second converters 15 and the cooling fins 64 of the inverter 16.

Therefore, in the instant embodiment, it is not necessary to provide separate or dedicated cooling air passages and cooling fans for the cooling fins 59 of the upper and lower second converters 15. Thus, with the instant embodiment arranged as above, it is possible to not only reduce the numbers of the cooling air passages and blowing fans, but also reduce the size of the space that would be required for providing such cooling air passages and blowing fans. In addition, because the upper and lower second converters 15, the inverter 16 and the cooling air passage 18 can be provided efficiently together close to one another in a compact space, it is possible to achieve a reduced weight and size of the portable power conversion apparatus 10.

Such a reduced weight and size of the power conversion apparatus 10 allow one or two persons to lift the apparatus 10 using the front and rear grips 28 and 29 (see FIG. 3). In this way, the instant embodiment can facilitate operation for carrying the power conversion apparatus 10 to a garage or the like for storage when the apparatus 10 is not to be used and operation for loading the apparatus 10 into a baggage compartment or the like of the vehicle and transferring the apparatus 10 to a place of use on the vehicle when the apparatus 10 is to be used. In the place of use, the power conversion apparatus 10 can be readily unloaded from the baggage compartment or the like of the vehicle and used.

Figure 7:
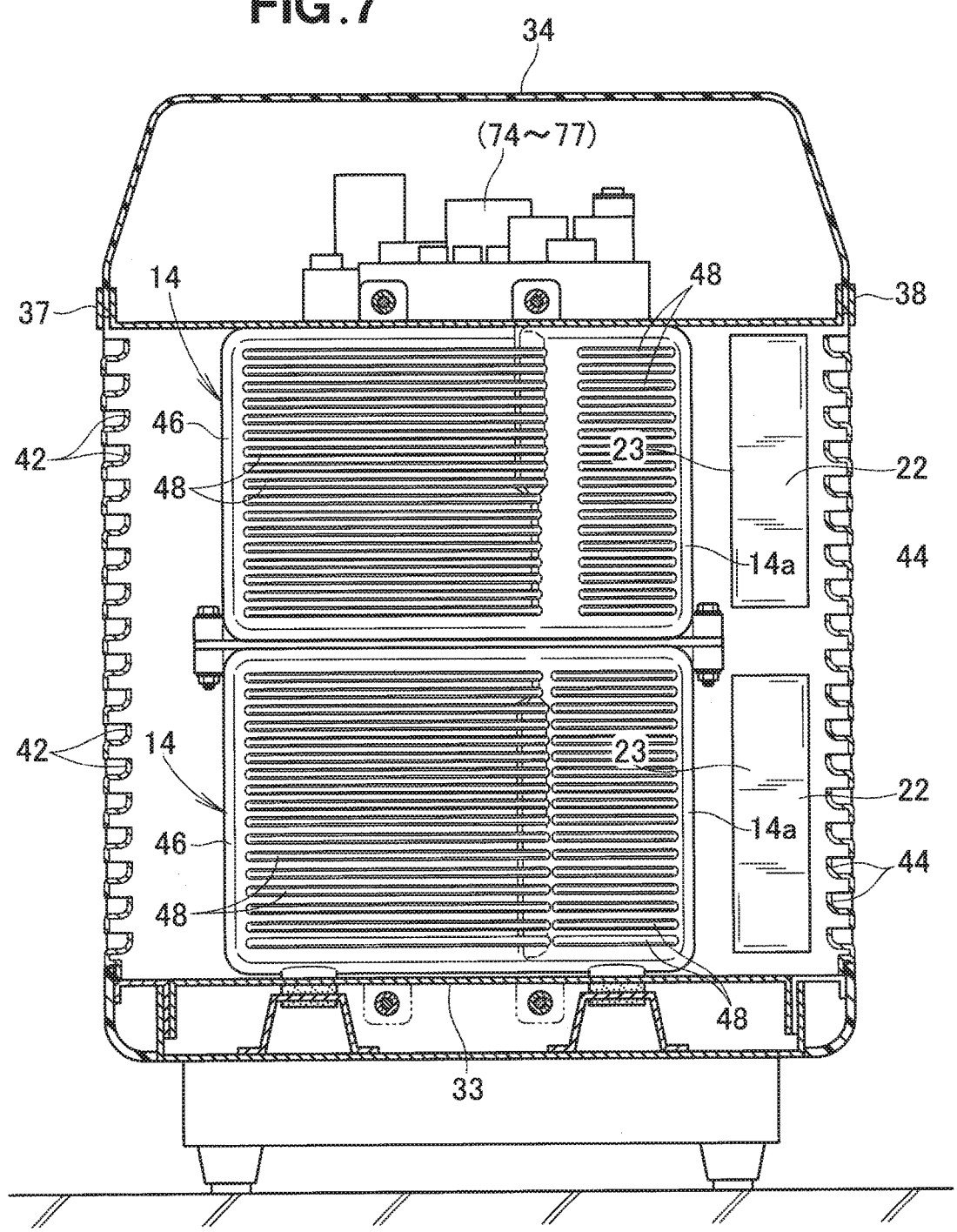
FIG. 7 is a sectional view taken along line 7-7 of FIG. 3.

Further, as shown in FIGS. 2 and 7, sucking fans 22 are provided in the downstream region 18b of the cooling air passage 18 and at their respective positions P1 (only one such position P1 is shown for simplicity) that are spaced (offset) rearward from the second converters 15. More specifically, the sucking fan 22 disposed at the upper offset position P1 will hereinafter be referred to as "upper sucking fan 22", and the sucking fan 22 disposed at the lower offset position P1 will hereinafter be referred to as "lower sucking fan 22".

A portion of the casing 11 located to the right of the upper sucking fan 22 and the lower sucking fan 22 (i.e., portion of the casing 11 adjacent to the outside 13) is opened through the right rear louver 44. The upper and lower sucking fans 22 are each an axial flow fan capable of sucking in air from the interior 12 of the casing 11 and discharging the sucked-in air to the outside 13. Thus, driving the upper and lower sucking fans 22 can discharge air from the interior 12 of the casing 11 to the outside 13.

Namely with the upper and lower sucking fans 22 provided at the offset positions P1 as noted above, respective air-sucking openings 23 of the upper and lower sucking fans 22 are located opposed to right end portions 14a of the upper and lower first converters 14.

In such, conditions, front portions of the air-sucking openings 23 of the upper and lower sucking fans 22 are opposed to front spaces 12a of the upper and lower first converters 14 in the interior 12 of the casing 11. Similarly rear portions of the air-sucking openings 23 of the upper and lower sucking fans 22 are opposed to rear spaces 12b of the upper and lower first converters 14. Thus, the air-sucking openings 23 of the upper and lower sucking fans 22 face the interior 12 of the air-sucking openings 23 of the upper and lower sucking fans 22 over a wide area or range, so that driving the sucking fans 22 can efficiently discharge air in the interior 12 of the casing 11 to the outside 13 of the casing 11.

In the power conversion apparatus 10, a portion of heat of the conversion devices 47, 58 and 63 of the first converters 14, upper and lower second converters 15 and inverter 16 is radiated to the interior 12 of the casing 11 from the surfaces of the conversion devices 47, 58 and 63. Further, heat of the heat-producing sources 74 to 77, such as the interface 74, the main contactor 75, the pre-charge contactor 76 and the resistor 77, is radiated to the interior 12 of the casing 11. In this way, the heat radiated to the interior 12 of the casing 11 can be discharged efficiently to the outside 13 of the casing 11 by the upper and lower sucking fans 22 discharging the air in the interior 12 to the outside 13.

Figure 8:
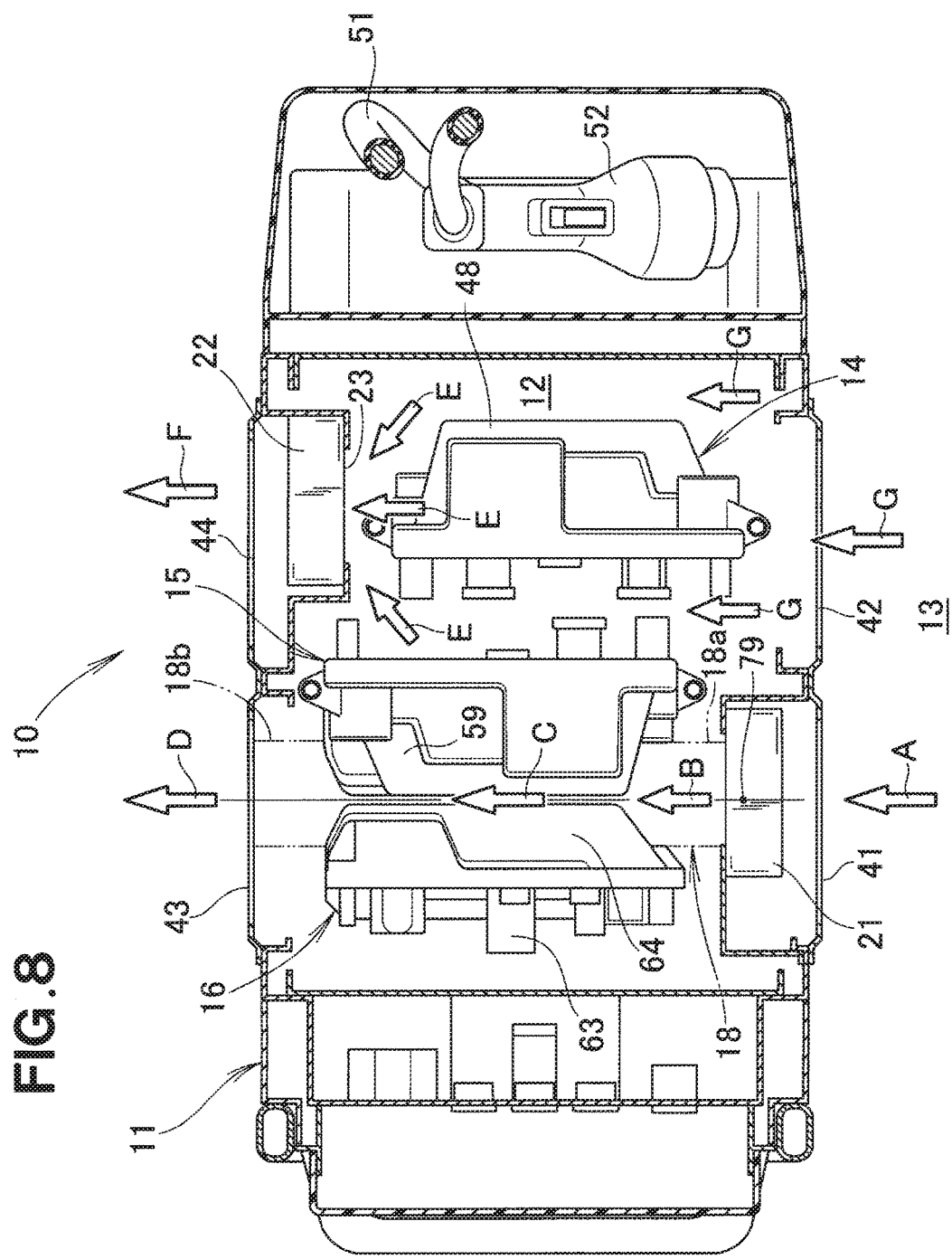
FIG. 8 is a view showing an example manner in which the power conversion apparatus of the invention is cooled.

The following describe, with primary reference to FIG. 8, an example manner in which the power conversion apparatus 10 is cooled. To facilitate understanding of the cooling action by the power conversion apparatus 10, the description will be given representatively only in relation to the lower first converter 14, lower second converter 15, lower blowing fan 21, lower sucking fan 22 and other elements related to such lower components.

As shown in FIG. 8, external air is sucked in, by driving of the blowing fan 21, from the outside 13 of the casing 11 to the blowing fan 21 through the left front louver 41 as indicated by arrow A. The external air sucked into the blowing fan 21 is blown out from the fan 21 to the upstream region 18a of the cooling air passage 18 as cooling air as depicted by arrow B. Such cooling air blown to the upstream region 18a is supplied from the upstream region 18a to the cooling air passage 18 as depicted by arrow C. The thus supplied cooling air is then discharged through the cooling air passage 18 and the right front louver 43 to the outside 13 as depicted by arrow D.

Thus, the cooling fins 59 of the second converter 15 and the cooling fins 64 of the inverter 16 are cooled by the cooling air supplied to the cooling air passage 18. Heat of the conversion devices 58 of the second converter 15 has been transmitted to the cooling fins 59 of the second converter 15, so that the conversion devices 58 of the second converter 15 can be maintained at suitable temperature. Further, heat of the conversion devices 63 of the inverter 16 has been transmitted to the cooling fins 64 of the inverter 16, so that the conversion devices 63 of the inverter 16 can be maintained at suitable temperature.

In the instant embodiment, an axial flow fan is used as the blowing fan 21, and the blowing fan 21 is provided on the extension line 79 of the cooling air passage 18. Thus, cooling air blown out from the blowing fan 21 can be supplied directly and straight to the cooling air passage 18. In this manner, a large amount, of cooling air can be applied efficiently from the blowing fan 21 to the cooling air passage 18, and thus, the cooling fins 59 of the second converter 15 and the cooling fins 64 of the inverter 16 can be efficiently cooled by the cooling air.

Further, the blowing fan 22 is disposed in the downstream region 18b of the cooling air passage 18 at the offset position P1 spaced rearward from the second converter 15, and the air-sucking openings 23 of the upper and lower sucking fan 22 faces the interior 12 of the casing 11 over a wide range. Thus, by driving of the sucking fan 22, air can be sucked into the sucking fan 22 from a wide range of the interior 12 of the casing 11 as depicted by arrow E. The thus-sucked air is discharged by the sucking fan 22 to the outside 13 of the casing 11 through the right rear louver 44 as depicted by arrow F. As the air is discharged from the interior 12 of the casing 11 to the outside 13 like this, external air is sucked in from the outside 13 of the casing 11 through the left rear louver 42 as depicted by arrow G.

By the air being discharged from a wide range of the interior 12 of the casing 11 as depicted by arrow F, heat radiated from the cooling fins 48 of the first converter 14 can be discharged to the outside together with the air within the casing 11. Further, heat radiated from the respective surfaces of the conversion devices 47 of the first converter 14, the conversion devices 58 of the second converter 15 and the conversion devices 63 of the inverter 16 can be discharged to the outside together with the air within the casing 11. Furthermore, heat radiated from the heat-producing sources 74 to 77, such as the interface 74, the main contactor 75, the pre-charge contactor 76 and the resistor 77, provided dispersedly within the casing 11 (see FIG. 3) can be discharged to the outside together with the air within the casing 11.

Thus, heat radiated from the first converter 14, the second converter 15, the inverter 16, the heat-producing sources 74 to 77, etc. can be efficiently discharged by means of the sucking fan 22 to the outside 13 of the casing 11. In this way, it is possible to efficiently cool the first converter 14, the second converter 15, the inverter 16, the heat-producing sources 74 to 77, etc. and thereby effectively increase the durability of the individual members.

It should be appreciated that the power conversion apparatus of the present invention may be modified as necessary without being limited to the above-described preferred embodiment. For example, whereas the preferred embodiment has been described above in relation to the plurality of cooling fins 59 and 64 functioning as the heat radiation sections, the present invention is not so limited. For example, a single plate member, a plurality of projections and depressions or the like may be provided on each of the upper and lower second converters 15 and the inverter 16 in such a manner that such single plate members, projections and depressions or the like are exposed to the cooling air passage 18.

Further, whereas the preferred embodiment of the invention has been described above as including the upper and lower first converters 14 and the upper and lower second converters 15, the present invention is not so limited. The upper and lower first converters 14 may be integrated into a single first converter 14, and the upper and lower second converters 15 may be integrated into a single second converter.

Further, whereas the preferred embodiment of the invention has been described above as including the upper and lower first converters 14, the upper and lower second converters 15, the upper and lower blowing fans 21 and the upper and lower sucking fans 22, the present invention is not so limited. For example, the present invention may include only one first converter 14, only one second converter 15, only one blowing fan 21 and only one sucking fan 22.

Furthermore, it should be appreciated that the shapes and constructions of the power conversion apparatus, casing, upper and lower first converters, upper and lower second converters, inverter, cooling air passage, upper and lower blowing fans, upper and lower sucking fans, cooling fins of the tipper and lower first converters, cooling fins of the upper and lower second converters, cooling fins of the inverter, etc. are not limited to those shown and described above in relation to the preferred embodiment and may be modified as appropriate.

Finally, the basic principles of the present invention are well suited for application to power conversion apparatus which include a plurality of power conversion units and a plurality of cooling fins and are capable of converting DC electric power into AC electric power by means of the plurality of cooling fins.

What is claimed is:

1. A portable power conversion apparatus for outputting AC electric power to an outside of the apparatus, the portable power conversion apparatus comprising:

an apparatus casing;

wheels provided at the apparatus casing;

a plurality of power conversion units provided within the apparatus casing and configured to convert DC electric power into AC electric power;

heat radiation sections respectively provided with the plurality of power conversion units;

a cooling air passage defined with the plurality of power conversion units disposed in such a manner that the heat radiation sections of the power conversion units are opposed to each other;

a first inlet louver provided at an entrance of the cooling air passage;

a first outlet louver provided at an exit of the cooling air passage;

a second outlet louver provided at a position spaced from the power conversion units defining the cooling air passage;

a sucking fan provided at the first inlet louver; and a discharging fan provided at the second outlet louver, wherein the discharging fan is provided at a position spaced from the power conversion units defining the cooling air passage, and the cooling air passage from the first inlet louver to the first outlet louver is in parallel to an axial direction of the wheels.

2. The power conversion apparatus according to claim 1, wherein the sucking fan is an axial flow fan provided on an extension line of the cooling air passage.

3. The power conversion apparatus according to claim 1, further comprising:

a second inlet louver provided at an entrance of a second cooling air passage having the second outlet louver.

4. The power conversion apparatus according to claim 1, wherein the heat radiation sections includes a plurality of cooling fins.

* * * * *